United States Patent
Terao et al.

(10) Patent No.: US 12,092,777 B2
(45) Date of Patent: Sep. 17, 2024

(54) RADIATION DETECTOR AND X-RAY CT APPARATUS

(71) Applicant: CANON MEDICAL SYSTEMS CORPORATION, Otawara (JP)

(72) Inventors: Yusuke Terao, Nasushiobara (JP); Tatsuo Osaka, Otawara (JP); Akihiko Taniguchi, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/643,932

(22) Filed: Dec. 13, 2021

(65) Prior Publication Data
US 2022/0187479 A1    Jun. 16, 2022

(30) Foreign Application Priority Data

Dec. 14, 2020  (JP) ................. 2020-206781

(51) Int. Cl.
*G01T 1/202* (2006.01)
*G01T 1/20* (2006.01)
*H01L 27/146* (2006.01)

(52) U.S. Cl.
CPC ............ *G01T 1/202* (2013.01); *G01T 1/2002* (2013.01); *G01T 1/2018* (2013.01); *H01L 27/14658* (2013.01)

(58) Field of Classification Search
None
See application file for complete search history.

(56) References Cited

U.S. PATENT DOCUMENTS

| 5,208,460 | A | 5/1993 | Rougeot et al. |
| 6,516,044 | B1 | 2/2003 | Lyons |
| 10,234,571 | B1 * | 3/2019 | Tornga ................. G01T 1/2023 |
| 2010/0127180 | A1 * | 5/2010 | Lifshitz ................. G01T 1/2002 |
| | | | 438/73 |
| 2021/0202802 | A1 * | 7/2021 | Bando .................... H01L 33/58 |

FOREIGN PATENT DOCUMENTS

JP    5-203755 A    8/1993

OTHER PUBLICATIONS

Extended European Search Report issued on May 9, 2022 in European Patent Application No. 21214363.0, 6 pages.

* cited by examiner

*Primary Examiner* — Edwin C Gunberg
(74) *Attorney, Agent, or Firm* — Oblon, McClelland, Maier & Neustadt, L.L.P.

(57) ABSTRACT

According to an embodiment, a radiation detector includes scintillator elements, dielectric multilayer films, and a metal reflective layer. The scintillator elements are arranged in a two-dimensional grid pattern. The dielectric multilayer films are provided between adjacent scintillator elements such that a dielectric multilayer film is adjacent to one of said scintillator elements. The metal reflective layer is provided between adjacent dielectric multilayer films.

5 Claims, 5 Drawing Sheets

RADIATION DETECTOR AND X-RAY CT APPARATUS

CROSS-REFERENCE TO RELATED APPLICATIONS

This application claims the benefit of priority of Japanese Patent Application No. 2020-206781, filed Dec. 14, 2020, the entire contents of which are incorporated herein by reference.

FIELD

Embodiments described herein relate generally to a radiation detector and an X-ray CT apparatus.

BACKGROUND

Radiation detectors such as X-ray detectors and gamma-ray detectors may use scintillator elements to convert radiation into visible light (scintillator light), and photodetectors such as photodiodes to convert the scintillator light into a charge signal for output. X-ray detectors may be used in X-ray imaging apparatuses such as X-ray diagnostic apparatuses and X-ray computed tomography (CT) apparatuses. Gamma-ray detectors may be used in nuclear medical diagnostic apparatuses such as single photon emission computed tomography (SPECT) apparatuses and positron emission tomography (PET) apparatuses. X-ray imaging apparatuses and nuclear medical diagnostic apparatuses generate medical images based on the output signal of the photodetector.

The scintillator elements of the radiation detector are arranged in a grid pattern on the photodetector. A reflective layer is preferably provided between the grids to prevent the scintillator light generated by the scintillator elements from entering the adjacent scintillator elements (crosstalk).

DETAILED DESCRIPTION

Hereinbelow, a description will be given of a radiation detector and an X-ray CT apparatus according to embodiments of the present invention with reference to the drawings.

According to an embodiment, a radiation detector includes scintillator elements, dielectric multilayer films, and a metal reflective layer. The scintillator elements are arranged in a two-dimensional grid pattern. The dielectric multilayer films are provided between adjacent scintillator elements such that a dielectric multilayer film is adjacent to one of said scintillator elements. The metal reflective layer is provided between adjacent dielectric multilayer films.

Radiation detectors in the following embodiments can be of the indirect conversion type with scintillator elements, and include, for example, flat panel type X-ray detectors used in X-ray imaging apparatuses such as X-ray diagnostic apparatuses and X-ray CT apparatuses, and gamma-ray detectors used in nuclear medicine diagnostic apparatuses such as SPECT apparatuses and PET apparatuses.

Figure 1:
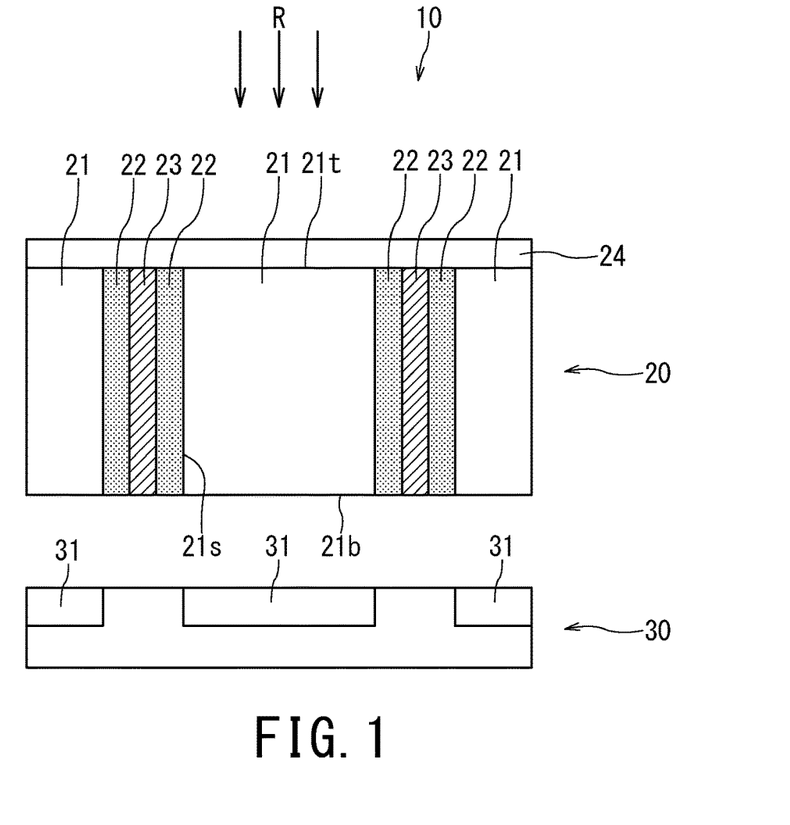
FIG. 1 is a partial cross-sectional view of an example of a radiation detector.

FIG. 1 is a partial cross-sectional view of an example of a radiation detector 10. The radiation detector 10 has a scintillator (scintillator array) 20 and a photodetector (photodetector array) 30.

The scintillator 20 has a plurality of scintillator elements 21 arranged in a two-dimensional grid pattern, dielectric multilayer films 22, metal reflective layers 23, and reflective paint 24.

The photodetector 30 has a plurality of photodetector elements 31 arranged in a two-dimensional grid pattern.

The photodetector elements 31 of the photodetector 30 have the function of converting the scintillator light into electrical signals according to the light intensity, and include optical sensors such as photodiodes and photomultiplier tubes (PMTS).

Figure 2:
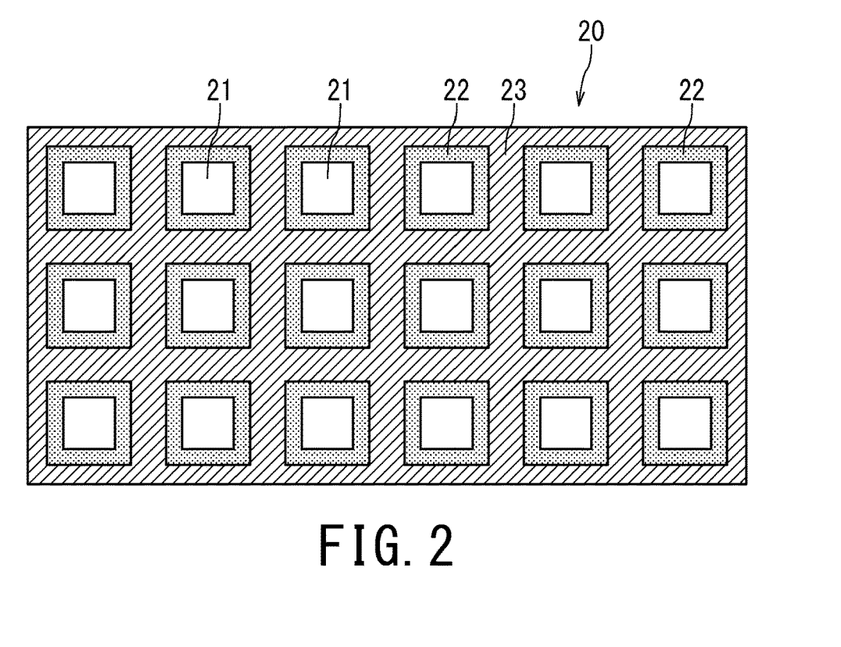
FIG. 2 is a front view of an example of a scintillator.

FIG. 2 is a front view of an example of the scintillator 20. In FIG. 2, the reflective paint 24 is omitted to avoid complications.

The scintillator element 21 has a first end face 21$t$ that receives incident radiation R, a second end face 21$b$ that is optically coupled to each of the photodetector elements 31, and a side wall 21$s$ that extend between the first and second end faces (see FIG. 1). The scintillator element 21 absorbs the energy of incident radiation R from the first end face 21$t$ and emits light (scintillator light) of a specific wavelength. The scintillator light of the scintillator element 21 is incident on a photodetector element 31 of a photodetector 30 through the second end face 21$b$.

Between adjacent scintillator elements 21, the dielectric multilayer film 22 is provided adjacent to one of those adjacent scintillator elements 21 (see FIG. 1). For example, the dielectric multilayer film 22, which reflects the scintillator light of the scintillator element, is laminated on the side wall 21$s$ of each of the multiple scintillator elements 21 to surround the scintillator element 21 (see FIG. 2).

Figure 3:
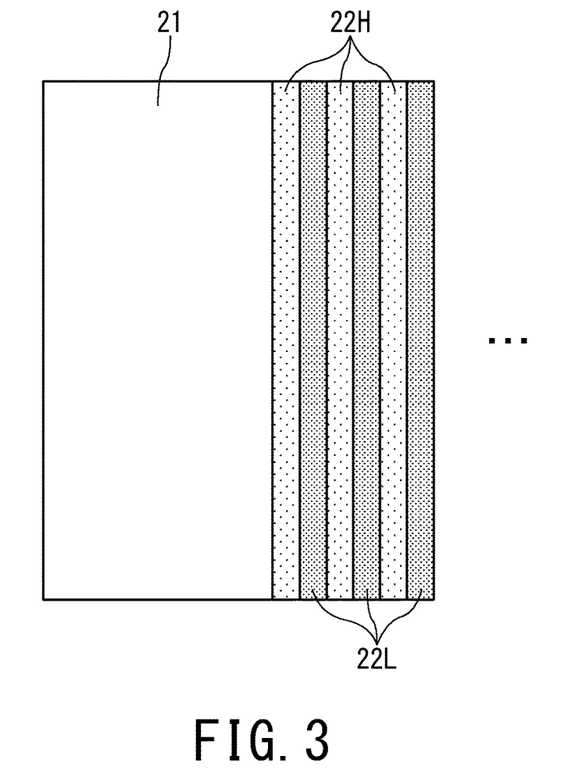
FIG. 3 is a partial cross-sectional view of an example of a dielectric multilayer film.

FIG. 3 is a partial cross-sectional view of an example of the dielectric multilayer film 22. The dielectric multilayer film 22 may be formed by stacking a plurality of pairs of dielectric layers having different refractive indices in the normal direction of the side wall 21$s$ of the scintillator element 21. For example, as shown in FIG. 3, the dielectric multilayer film 22 is formed by alternately stacking a dielectric layer 22H having a high refractive index and a dielectric layer 22L having a low refractive index in the normal direction of the side wall 21$s$ of the scintillator element 21.

In this case, the dielectric multilayer film 22 is formed such that the thickness of all layers is $\lambda/4$ of the optical path length for the scintillator light wavelength $\lambda$. The reflected light at the interface of each layer of the dielectric multilayer film 22 is in phase with each other and thus strengthens each other. On the other hand, the transmitted light at the interface of each layer cancels each other due to multiple reflections. Thus, the wavelength characteristics of the reflectance of dielectric multilayer film 22 can have a wavelength interval in which the reflectance is close to 100%. Therefore, the dielectric multilayer film 22 can reflect the scintillator light with a very high reflectance by being designed in line with the wavelength λ of the scintillator light of the scintillator element 21.

By providing the dielectric multilayer film 22 between the scintillator elements, crosstalk (a phenomenon in which scintillator light generated in the scintillator element 21 enters the adjacent scintillator element 21) can be greatly reduced.

However, the dielectric multilayer film 22 is known to shift (blueshift) the wavelength interval, where the reflectance is close to 100%, to the short wavelength side as the angle of incidence of light increases from 0 degrees (differs from perpendicular incidence).

Figure 4:
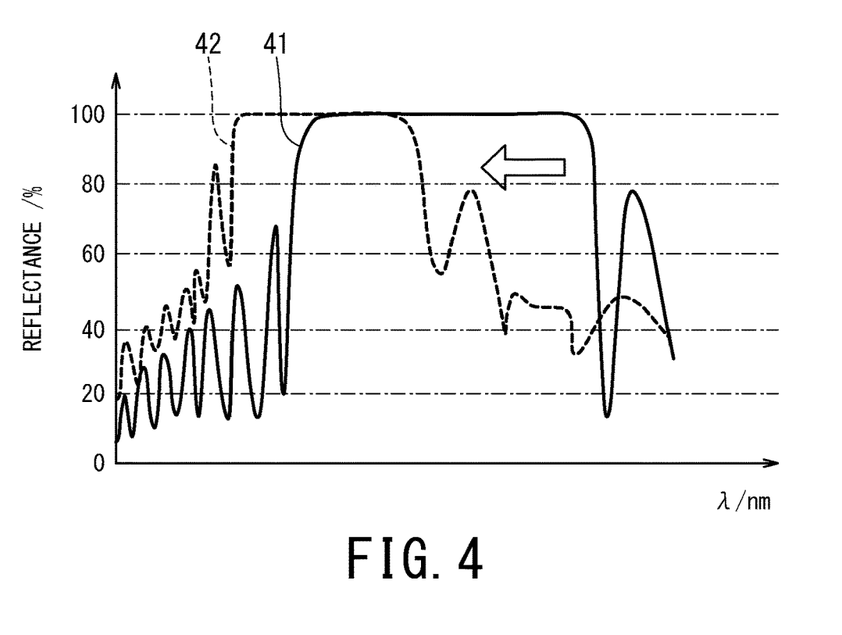
FIG. 4 is a diagram for explaining the phenomenon of a blueshift in the wavelength characteristics of the reflectance of a dielectric multilayer film as an angle of incidence of light increases.

FIG. 4 is a diagram for explaining the phenomenon of a blueshift in the wavelength characteristics of the reflectance of the dielectric multilayer film 22 as the angle of incidence of light increases.

FIG. 4 shows an example of the wavelength characteristics 41 in which light is incident vertically on dielectric multilayer film 22 at an angle of incidence of 0 degrees and the wavelength characteristics 42 in which light is incident at an angle of incidence of 45 degrees. As shown in FIG. 4, the dielectric multilayer film 22 has the property that the wavelength characteristic of reflectance shifts to the short wavelength side as the angle of incidence increases from 0 degrees.

In this way, the wavelength characteristic of the reflectance of dielectric multilayer film 22 has an incident angle dependency. Therefore, even if the dielectric multilayer film 22 is designed according to the wavelength λ of the scintillator light of the scintillator element 21, the reflectance will decrease depending on the angle of incidence of the scintillation light to the dielectric multilayer film 22. As a result, the scintillation light penetrates the dielectric multilayer film 22 and enters the neighboring scintillator element 21.

The radiation detector 10 according to the embodiments has a metal reflective layer 23 to prevent crosstalk caused by the dependence of the wavelength characteristics of the reflectance of the dielectric multilayer film 22 on the angle of incidence.

Figure 5:
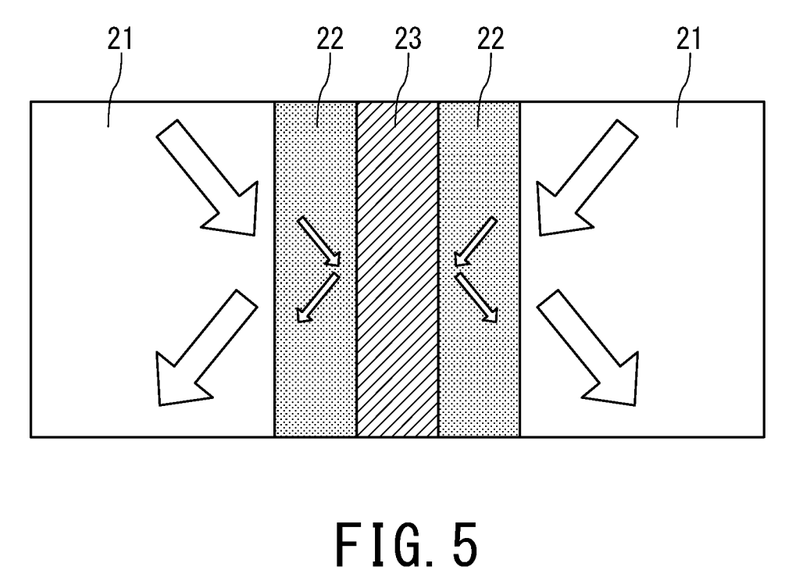
FIG. 5 is an explanatory diagram showing an example of how the scintillator light transmitted through the dielectric multilayer film is reflected by the metal reflective layer.

FIG. 5 is an explanatory diagram showing an example of how the scintillator light transmitted through the dielectric multilayer film is reflected by the metal reflective layer.

The metal reflective layer 23 is made of metal. The metal reflective layer 23 is provided between the adjacent dielectric multilayer films 22 (see FIG. 1). Specifically, the metal reflective layer 23 is stacked around the dielectric multilayer film 22 so as to surround the dielectric multilayer film 22 as shown in FIG. 2. The metal reflective layer 23 has a slightly higher loss of reflected light with respect to the incident light than the dielectric multilayer film 22, but has no dependence on the incident angle of the wavelength characteristic of the reflectance.

As mentioned above, depending on the angle of incidence of the scintillation light to the dielectric multilayer film 22, the scintillation light will transmit through dielectric multilayer film 22. However, the scintillation light transmitted through the dielectric multilayer film 22 is reflected by the metal reflective layer 23 and returns to the scintillator element 21 (see FIG. 5).

The radiation detector 10 according to the embodiments includes the dielectric multilayer film 22 laminated around each of the scintillator elements 21 and the metal reflective layer 23 laminated around the dielectric multilayer film 22. Thus, the scintillator light of the scintillator element 21 is reflected by the dielectric multilayer film 22 at a very high reflectivity. In addition, the scintillator light, which has a large angle of incidence to the dielectric multilayer film 22 and is transmitted through the dielectric multilayer film 22, is reflected by the metal reflective layer 23. Therefore, according to the radiation detector 10, the crosstalk of the radiation detector 10 using the dielectric multilayer film 22 as a reflective layer can be reduced.

The two-dimensional grid pattern arrangement of the plurality of scintillator elements 21 may be achieved, for example, by laminating the dielectric multilayer film 22 and the metal reflective layer 23 on each of the scintillator elements 21, and then bonding the metal reflective layers 23 of each of the scintillator elements 21 to each other with an adhesive or by welding.

The metal reflective layers 23 of each of the scintillator elements 21 may be bonded together without using an adhesive. In the case of bonding without using an adhesive, the thickness of the reflective layer provided between the scintillator elements 21 can be thinner than in the case of bonding with an adhesive or welding. As a result, the effective area of the scintillator element per pixel can be increased, and higher resolution images can be achieved. Bonding without using adhesives includes bonding with heating.

Figure 6:
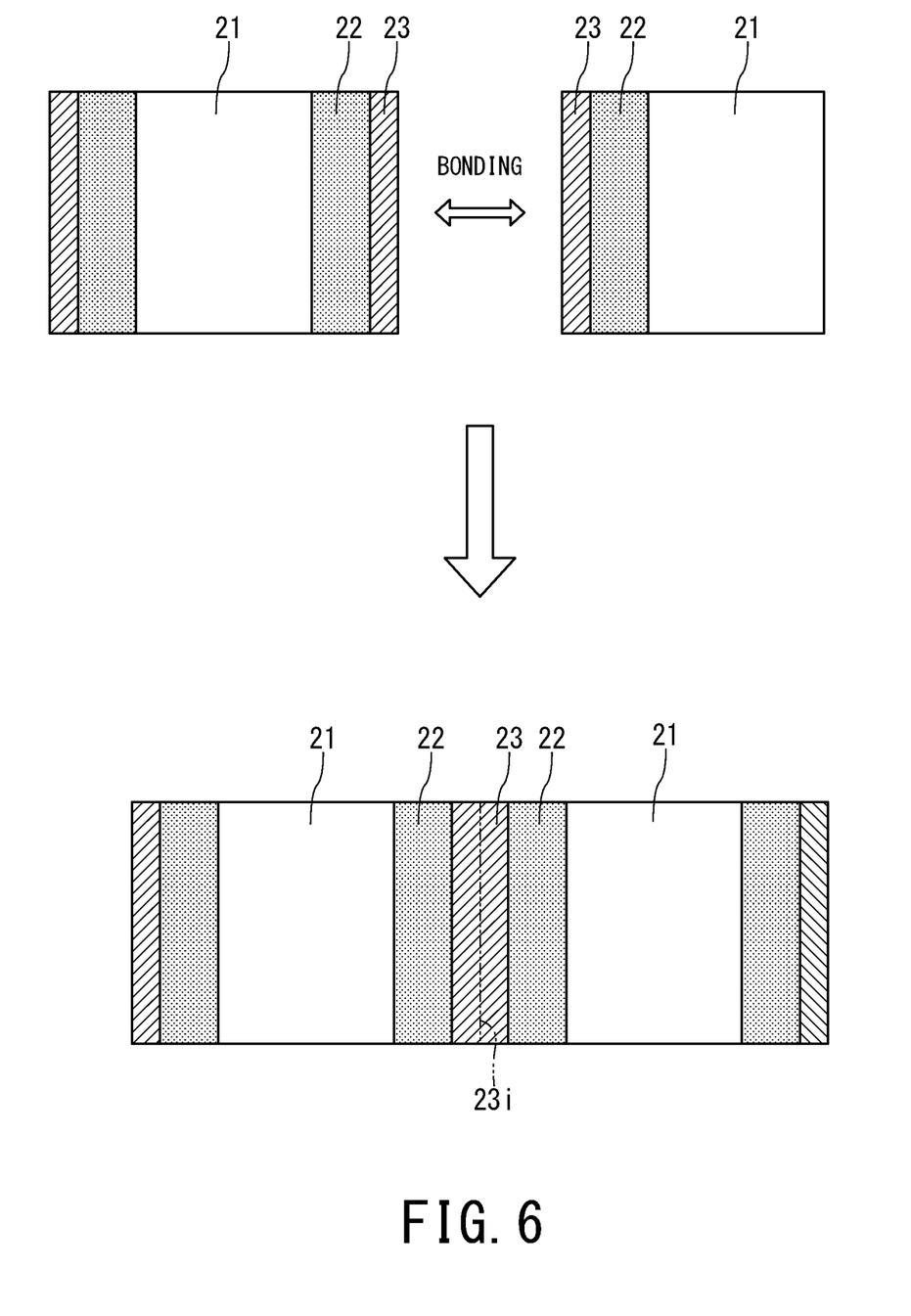
FIG. 6 is an explanatory diagram showing an example of bonding metal reflective layers at room temperature.

FIG. 6 is an explanatory diagram showing an example of bonding the metal reflective layers 23 at room temperature. As shown in FIG. 6, the metal reflective layers 23 of each of the scintillator elements 21 may be bonded together at room temperature. Various conventional methods for bonding metal surfaces at room temperature, such as an atomic diffusion bonding and a surface activation bonding, are known, and any of these can be used.

In the radiation detector 10 according to the embodiments, when the metal reflective layers 23 are bonded together at room temperature, the thickness of the interface 23i of the metal reflective layers 23 can be made so thin that it can be almost negligible. Further, there is no need to heat the dielectric multilayer film 22 and the scintillator element 21 underneath the metal reflective layer 23.

Therefore, when bonding the metal reflective layers 23 at room temperature, the heating process is not require, and the man-hours required to fabricate the radiation detector 10 can be reduced. In this case, defects caused by heating, such as thermal deformation and denaturation of the dielectric multilayer film 22 and the scintillator element 21, can be prevented. Furthermore, when the metal reflective layers 23 are bonded together at room temperature, higher bonding strength can be obtained as compared with welding. This can contribute to the improvement of the yield rate in the post-bonding process.

The metal reflective layer 23 may be composed of a heavy metal such as tungsten, bismuth, or molybdenum, which has a radiation shielding effect. In this case, in addition to the scintillator light, the metal reflective layer 23 can reflect the incident radiation R that has been transmitted straight through the dielectric multilayer film 22. In this case, a heavy metal with a higher energy level than that of the scintillator element 21 may be used as the heavy metal. By configuring the metal reflective layer 23 with a heavy metal having a radiation shielding effect, it is possible to have a radiation shielding effect between the scintillator elements 21.

Next, an example in which the radiation detector 10 is used in the X-ray CT apparatus will be described.

Figure 7:
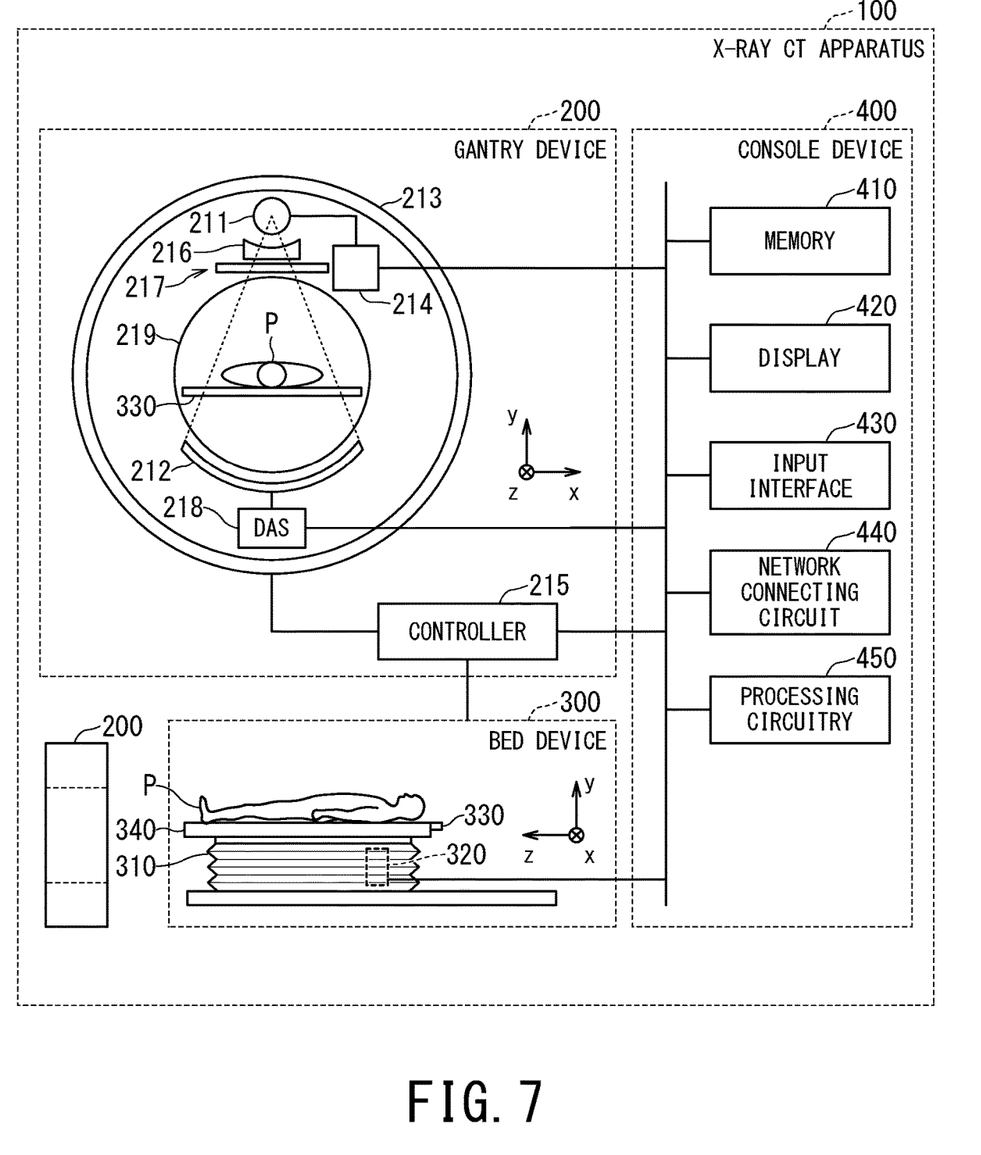
FIG. 7 is a block diagram showing an example of an X-ray CT apparatus having the radiation detector shown in FIG. 1 as it's X-ray detector.

FIG. 7 is a block diagram showing an example of the X-ray CT apparatus 100 having the radiation detector 10 shown in FIG. 1 as it's X-ray detector 212. The X-ray CT apparatus 100 shown in FIG. 7 has a single gantry device 200, but for convenience of explanation, a plurality of gantry devices 200 are depicted in FIG. 7.

As shown in FIG. 7, the X-ray CT apparatus 100 includes a gantry device 200, a bed device 300, and a console device 400. In the embodiment, the rotational axis of the rotating frame 213 in the non-tilted state or the longitudinal direction of the tabletop 330 of the bed device 300 is defined as the z-axis direction, the direction orthogonal to the z-axis and parallel to the floor surface is defined as the x-axis direction, and an axial direction perpendicular to the floor surface is defined as the y-axis direction (see FIG. 7).

The X-ray CT apparatus 100 may be configured as any one of different types, such as a so-called third generation CT apparatus, i.e., an Rotate/Rotate type in which an X-ray tube and an X-ray detector integrally rotate about an object, or as a so-called fourth generation CT apparatus, i.e., an Stationary/Rotate type or an Nutate/Rotate type in which multiple detecting elements are circularly arrayed and only the X-ray tube rotates about the object. In the following, an example of adopting the third generation Rotate/Rotate type as the X-ray CT apparatus 100 according to the present embodiment is explained.

The gantry device 200 includes an X-ray tube 211, an X-ray detector 212, a rotating frame 213 having an opening portion 219 in which an imaging region resides, an X-ray high voltage device 214, a controller 215, a wedge 216, a collimator 217, and a DAS (Data Acquisition System) 218.

The X-ray tube 211 has a vacuum tube housing a cathode and an anode. The X-ray tube 211 is an example of an X-ray source.

The X-ray tube 211 according to the embodiments is applicable to a single tube type X-ray CT apparatus, and also applicable to a so-called multi-tube type X-ray CT apparatus in which a plurality of pairs of an X-ray tube and an X-ray detector is mounted on a rotating ring.

The x-ray detector 212 has the same configuration as the radiation detector 10 shown in FIGS. 1-6. The X-ray detector 212 detects X-rays that is irradiated from the X-ray tube 211 and passes through the object, and outputs an electric signal corresponding to the detected amount of X-rays to the DAS 218. The X-ray detector 212 has an array of X-ray detection elements consisting of multiple scintillator elements 21 and photodetector elements 31 in the channel direction along one arc centered on the focal point of the X-ray tube 211. For example, the X-ray detector 212 has a structure in which the plurality of X-ray detection element arrays in the channel direction is arrayed in a slice direction (column direction, row direction).

The rotating frame 213 is an annular frame that supports the X-ray tube 211 and the X-ray detector 212 so as to face each other and rotates the X-ray tube 211 and the X-ray detector 212 by the controller 215 described below. In addition to the X-ray tube 211 and the X-ray detector 212, the rotating frame 213 further includes and supports the X-ray high voltage device 214 and the DAS 218.

The detection data generated by the DAS 218 is transmitted from a transmitter having a light emitting diode (LED) provided in the rotating frame 213 by optical communication to a receiver having a photo diode provided in a non-rotating portion of the gantry device 200, e.g., a fixed frame (not shown), and is then transferred to the console device 400. A fixed frame (not shown) is a frame that rotatably supports the rotating frame 213. The method of transmitting the detection data from the rotating frame 213 to the non-rotating part of the gantry device 200 is not limited to the optical communication, and any method may be adopted as long as it is non-contact type data transmission.

The X-ray high voltage device 14 may be provided on the rotating frame 213 or on the fixed frame side of the gantry device 200.

The controller 215 has a processor on a control board, a memory, and a driving mechanism such as a motor and an actuator. The controller 215 receives an input signal from an input interface 430 attached to the console device 400 or the gantry device 200, and controls the gantry device 200 and the bed device 300. For example, the controller 215 performs rotation control of the rotating frame 213 in response to the input signal, tilt control of the gantry device 200, and driving control of the bed device 300 and the tabletop 330. The tilt control of the gantry device 200 is made by the controller rotating the rotating frame 213 around an axis parallel to the X axis direction on the basis of the tilt angle information input by the input interface attached to the gantry device 200. The controller 215 may be provided in the gantry device 200 or may be provided in the console device 400.

The wedge 216 is a filter for adjusting the amount of X-rays irradiated from the X-ray tube 211. Specifically, the wedge 216 transmits and attenuates the X-rays irradiated from the X-ray tube 211 such that the X-rays applied to the object P from the X-ray tube 211 have a predetermined distribution. For example, the wedge 216 (wedge filter, bow-tie filter) is a filter in which aluminum is processed to have a predetermined target angle or a predetermined thickness.

The collimator 217 is a lead plate or the like for narrowing the irradiation range of the X-rays transmitted through the wedge 216, and forms a slit by combining a plurality of lead plates or the like. The collimator 217 may also be referred to as an X-ray variable diaphragm.

The DAS 218 includes an amplifier that performs amplification processing on electric signals output from the respective photodetector elements 31 of the X-ray detector 212 and an A/D converter that converts the electric signals into digital signals (A/D conversion), and generates detection data. The detection data generated by the DAS 218 is transferred to the console device 400.

The bed device 300 is a device for placing and moving the object to be scanned, and includes a base 310, a bed driving device 320, the tabletop 330, and a support frame 340.

The base 310 is a casing that supports the support frame 340 movably in the vertical direction (y direction). The bed driving device 320 is a motor or an actuator that moves the tabletop 330 on which the object is placed in the longitudinal direction (z direction) of the tabletop 330. A tabletop 330 provided on the upper surface of the support frame 340 is a plate on which the object is placed.

In addition to the tabletop 330, the bed driving device 320 may move the support frame 340 in the long axis direction (z direction) of the tabletop 330. Further, the bed driving device 320 may be moved together with the base 310 of the bed device 300. In the case where the present invention can be applied to a standing CT (an X-ray CT apparatus adapted to a standing object), the patient movement mechanism may be moved instead of the tabletop 330.

The console device 400 has a memory 410, a display 420, an input interface 430, a network connecting circuit 440, and a processing circuitry 450. The console device 400 is described as a separate entity from the gantry device 200, but some or all of the components of the console device 400 may be included in the gantry device 200. It is noted that the console apparatus 400 will be described as executing all functions with a single console in the present embodiment, but these functions may be executed by a plurality of consoles.

The memory 410 includes a processor-readable recording medium such as a semiconductor memory element, e.g., a RAM (Random Access Memory) or a flash memory, a hard disk, an optical disk, and the like. The memory 410 stores, for example, projection data, reconstructed image data, and volume data of the object acquired in advance.

The display 420 displays various kinds of information. For example, the display 420 outputs a medical image (CT image) generated by the processing circuitry 450, a GUI (Graphical User Interface) for receiving various operations from the user, and the like. For example, the display 420 is a liquid crystal display, CRT (Cathode Ray Tube) display, OLED (Organic Light Emitting Diode) display, or the like. The display 420 may be provided on the gantry device 200. The display 420 may be a desktop type or may consist of a tablet device or other device capable of wireless communication with the main body of the console device 400.

The input interface 430 accepts various input operations from the user, converts the accepted input operations into electric signals, and outputs them to the processing circuitry 450. For example, the input interface 430 receives from the user the collection conditions for collecting projection data, the reconstruction conditions for reconstructing a CT image, the image processing conditions for generating a post-processing image from a CT image, and the like. For example, the input interface 430 is a mouse, a keyboard, a trackball, a switch, a button, a joystick, a touch pad that performs input operation by touching the operation surface, a touch screen that integrates a display screen and a touch pad, a non-contact input circuit using optical sensor, and a voice input circuit. The input interface 430 may also be provided on the gantry device 200. The input interface 430 may also be configured as a tablet device that can wirelessly communicate with the console device 400.

The network connecting circuit 440 implements various information communication protocols according to the network. The network connecting circuit 440 connects the X-ray CT apparatus 100 and other devices such as an image server in accordance with these various protocols. For this connection, electrical connection via an electronic network or the like can be applied. The network refers to a general information communication network using telecommunications technology and includes not only a wireless/wired LAN hospital backbone local area network (LAN) and the Internet network, but also a telephone communication network, an optical fiber communication network, a cable communication network, a satellite communication network, and other networks.

The processing circuit 450 is a processor that controls the overall operation of the x-ray CT apparatus 100 by reading and executing the program stored in the memory 410.

The radiation detector 10 described with reference to FIGS. 1-6 can thus be used in the X-ray CT apparatus 100 as the X-ray detector 212.

According to at least one of the above-described embodiments, crosstalk in the radiation detector 10 having the dielectric multilayer film 22 as the reflective layer can be reduced.

The processing circuitry in the above-described embodiments is an example of the processing circuitry described in the claims. In addition, the term "processor" used in the explanation in the above-described embodiments, for instance, refers to circuitry such as dedicated or general purpose CPUs (Central Processing Units), dedicated or general-purpose GPUs (Graphics Processing Units), or ASICs (Application Specific Integrated Circuits), programmable logic devices including SPLDs (Simple Programmable Logic Devices), CPLDs (Complex Programmable Logic Devices), and FPGAs (Field Programmable Gate Arrays), and the like. The processor implements various types of functions by reading out and executing programs stored in the memory circuitry. In addition, when the processor is an ASIC, instead of storing the program in a memory circuit, the function corresponding to the program is directly embedded in the processor circuit as a logic circuit. In this case, the processor realizes various functions by hardware processing that reads and executes the program embedded in the circuit. Alternatively, the processor can combine software processing and hardware processing to realize various functions.

In addition, instead of storing programs in the memory circuitry, the programs may be directly incorporated into the circuitry of the processor. In this case, the processor implements each function by reading out and executing each program incorporated in its own circuitry. Moreover, although in the above-described embodiments an example is shown in which the processing circuitry configured of a single processor implements every function, the processing circuitry may be configured by combining plural processors independent of each other so that each processor implements each function of the processing circuitry by executing the corresponding program. When a plurality of processors are provided for the processing circuitry, the memory medium for storing programs may be individually provided for each processor, or one memory circuitry may collectively store programs corresponding to all the functions of the processors.

While certain embodiments have been described, these embodiments have been presented by way of example only, and are not intended to limit the scope of the inventions. Indeed, the embodiments described herein may be embodied in a variety of other forms; furthermore, various omissions, substitutions, changes in the form of the embodiments described herein and combination of embodiments may be made without departing from the spirit of the inventions. The accompanying claims and their equivalents are intended to cover such forms or modifications as would fall within the scope and spirit of the inventions.

(aspect 1) For instance, according to an embodiment, a radiation detector includes scintillator elements, dielectric multilayer films, and a metal reflective layer. The scintillator elements are arranged in a two-dimensional grid pattern. Each of the dielectric multilayer films is provided between adjacent scintillator elements and adjacent to one of said scintillator elements. The metal reflective layer is provided between adjacent dielectric multilayer films.

(aspect 2) A radiation detector according to an embodiment includes a photodetector, a scintillator, dielectric multilayer films, and metal reflective layers. The photodetector has photodetector elements arranged in a two-dimensional grid pattern. The scintillator has scintillator elements arranged in a two-dimensional grid pattern. Each of the scintillator elements has a first end face receiving incident radiation, a second end face optically coupled to each of the photodetector elements, and a side wall extending between the first end face and the second end face. Each of the dielectric multilayer films is laminated around the side wall of the each scintillator element to reflect scintillator light of the each scintillator element. The metal reflective layers are laminated around the each dielectric multilayer film and reflects the scintillator light transmitted through the each dielectric multilayer film.

(aspect 3) The scintillator elements may be arranged in the two-dimensional grid pattern by bonding the metal reflective layers.

(aspect 4) The metal reflective layers may be bonded by room-temperature bonding.

(aspect 5) The room-temperature bonding may be either an atomic diffusion bonding or a surface activated bonding.

(aspect 6) The metal reflective layer may be composed of a heavy metal having a radiation shielding effect.

(aspect 7) Each dielectric multilayer film may be formed by stacking a plurality of pairs of dielectric layers having different refractive indices around respective side walls of the scintillator elements in the direction normal to the side walls.

(aspect 8) An X-ray CT apparatus according to an embodiment includes an X-ray source generating X-rays, and the radiation detector as described above that detects X-rays transmitted through an object.

What is claimed is:

1. A radiation detector, comprising:
    a photodetector having photodetector elements arranged in a two-dimensional grid pattern;
    scintillator elements arranged in a two-dimensional grid pattern;
    dielectric multilayer films, each of which is provided between adjacent scintillator elements and adjacent to one of said scintillator elements; and
    a metal reflective layer provided between adjacent dielectric multilayer films, wherein each of the metal reflective layers are bonded by room-temperature bonding,
    wherein each scintillator element of the scintillator elements arranged in the two-dimensional grid pattern has a first end face receiving incident radiation, a second end face optically coupled to a respective one of the photodetector elements, and a side wall extending between the first end face and the second end face,
    each dielectric multilayer film of the dielectric multilayer films is laminated around the side wall of the each scintillator element to reflect scintillator light of the each scintillator element,
    each metal reflective layer of the metal reflective layers is laminated around the each dielectric multilayer film and reflects the scintillator light transmitted through the each dielectric multilayer film, and
    the scintillator elements are arranged in the two-dimensional grid pattern by bonding the metal reflective layers.

2. The radiation detector according to claim 1, wherein the room-temperature bonding is either an atomic diffusion bonding or a surface activated bonding.

3. The radiation detector according to claim 1, wherein the metal reflective layer is composed of a heavy metal having a radiation shielding effect.

4. The radiation detector according to claim 1, wherein the each of the dielectric multilayer films is formed by stacking a plurality of pairs of dielectric layers having different refractive indices around respective side walls of the scintillator elements in the direction normal to the side walls.

5. An X-ray CT apparatus comprising:
    an X-ray source generating X-rays; and
    the radiation detector according to claim 1 that detects X-rays transmitted through an object.

* * * * *